United States Patent
Lesea et al.

(10) Patent No.: US 7,003,679 B1
(45) Date of Patent: Feb. 21, 2006

(54) SYSTEM AND METHOD FOR STORING A CHARGING ALGORITHM AND CHARGING METHODOLOGY ASSOCIATED WITH A BATTERY AND SELECTIVELY CONNECTING A CRITICAL CIRCUIT TO A BATTERY VOLTAGE PIN

(75) Inventors: Austin H. Lesea, Los Gatos, CA (US); John S. Elward, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 718 days.

(21) Appl. No.: 09/976,395

(22) Filed: Oct. 12, 2001

(51) Int. Cl.
*G06F 1/26* (2006.01)
*H02J 7/00* (2006.01)

(52) U.S. Cl. ............... 713/300; 320/107; 320/125; 320/137

(58) Field of Classification Search ............... 713/300, 713/340; 320/106, 107, 124, 125, 137
See application file for complete search history.

(56) References Cited

U.S. PATENT DOCUMENTS

| | | | | |
|---|---|---|---|---|
| 5,184,059 A | * | 2/1993 | Patino et al. ............... | 320/125 |
| 5,637,413 A | * | 6/1997 | Fernandez et al. .......... | 429/7 |
| 5,666,006 A | * | 9/1997 | Townsley et al. ........... | 307/66 |
| 5,698,971 A | * | 12/1997 | Sahai et al. ................. | 323/282 |
| 5,751,134 A | * | 5/1998 | Hoerner et al. ............. | 320/124 |
| 6,157,167 A | * | 12/2000 | Schwartz et al. ........... | 320/122 |

OTHER PUBLICATIONS

Nelson et al, Digital Logic Circuit Analysis and Design, 1995, Prentice-Hall Inc., pp. 268-269.*

* cited by examiner

*Primary Examiner*—Thomas Lee
*Assistant Examiner*—Mark Connolly
(74) *Attorney, Agent, or Firm*—Jeanette S. Harms; LeRoy D. Maunu; Lois D. Cartier (57) ABSTRACT

Battery management can be advantageously integrated into a programmable logic device (PLD). Specifically, by using a programmable battery controller provided on the PLD, the user can make a decision regarding battery choice much later in the design process, reduce the inventory of batteries associated with the system/product, increase the life of the batteries, and upgrade to the newest technology battery at the user's discretion. The battery controller can be implemented on any type of PLD, e.g., an FPGA, potentially requiring battery management for critical circuits.

14 Claims, 4 Drawing Sheets

PRIOR ART

SYSTEM AND METHOD FOR STORING A CHARGING ALGORITHM AND CHARGING METHODOLOGY ASSOCIATED WITH A BATTERY AND SELECTIVELY CONNECTING A CRITICAL CIRCUIT TO A BATTERY VOLTAGE PIN

BACKGROUND OF THE INVENTION

1. Field of the Invention

The present invention relates to a programmable logic device (PLD) and particularly to a programmable battery controller in the PLD.

2. Description of the Related Art

The use of batteries for systems and circuits in today's increasingly mobile, broadband society is ubiquitous. Many of these system/circuit applications require significantly longer battery lives as well as smaller battery area than previous generations of applications. To meet these specifications, new chemistries, charging algorithms, and charging methodologies are constantly being developed for batteries. Currently, application specific integrated circuits (ASICs) can provide the algorithms and implement the methodologies for charging this new generation of batteries. Exemplary battery charging ASICs include the MAX712 sold by Maxim, the BQ2063 sold by Texas Instruments, and the S-8243 sold by Seiko. Unfortunately, due to the wide range of algorithms and methodologies that are provided, the use of an ASIC is limited to only one battery chemistry. Moreover, these battery charging ASICs include predetermined pins for setting the number of batteries in series. Thus, once this ASIC is installed, the user is locked into the size of the battery system, the battery chemistry, and the end of life voltages.

Therefore, a need arises for a method and circuit for allowing an integrated circuit to provide multiple algorithms and implement multiple methodologies. Moreover, a need arises for a method and a circuit readily adaptable to new algorithms and methodologies, thereby allowing a user to take advantage of new technology.

SUMMARY OF THE INVENTION

In accordance with one feature of the invention, battery management can be advantageously integrated into a programmable logic device (PLD). Specifically, a battery controller provided on the PLD can ensure that power demands for any application can be met. By using this programmable solution, the user can make the decision regarding battery choice much later in the design process, reduce the inventory of batteries associated with the system/product, increase the life of the batteries, and upgrade to the newest technology battery at the user's discretion. The battery controller can be implemented on any type of PLD, e.g., a FPGA, potentially requiring battery management.

The PLD can include a battery voltage pin, a battery controller connected to the battery voltage pin, and at least one critical circuit selectively connected to the battery voltage pin. The battery controller can include a memory for storing a charging algorithm and a charging methodology associated with a battery external to the PLD and connectable to the battery voltage pin. The battery controller can also include a battery charger controlled by the battery controller and operatively coupled to the battery voltage pin, the battery charger charges the battery using the charging algorithm and the charging methodology.

The PLD can further include a voltage source pin connected to the at least one critical circuit and a voltage detector connected to the voltage source pin. The voltage detector can selectively connect the battery voltage pin to the at least one critical circuit. In one embodiment, the battery controller can further include end of life circuitry operatively coupled to the battery voltage pin.

In another embodiment, the PLD can include first and second battery voltage pins and a battery controller selectively connected to one of the first battery voltage pin and the second battery voltage pin. The PLD includes at least one critical circuit selectively connected to either the first battery voltage pin or the second battery voltage pin. The PLD can include a analog demultiplexer having an input terminal connected to the battery controller, a first output terminal selectively connected to the first battery voltage pin, and a second output terminal selectively connected to the second battery voltage pin. The PLD can also include an analog multiplexer having a first input terminal connected to the first battery voltage pin, a second input terminal connected to the second battery voltage pin, and an output terminal selectively connected to the at least one critical circuit.

The battery controller can include a memory for storing a plurality of charging algorithms and a plurality of charging methodologies. A first charging algorithm and a first charging methodology are associated with a first battery external to the PLD and connectable to the first battery voltage pin. A second charging algorithm and a second charging methodology are associated with a second battery external to the PLD and connectable to the second battery voltage pin. A battery charger, controlled by the battery controller and operatively coupled to the input terminal of the analog demultiplexer, can charge either the first battery using the first charging algorithm and the first charging methodology or the second battery using the second charging algorithm and the second charging methodology.

The PLD can further include a voltage source pin connected to the at least one critical circuit and a voltage detector connected to the voltage source pin. The voltage detector selectively connects the output terminal of the analog multiplexer to the at least one critical circuit. In one embodiment, the battery controller can further include end of life circuitry operatively coupled to at least one the first battery voltage pin and the second battery voltage pin.

A method of fabricating a PLD is also provided. The method includes providing a battery voltage pin, connecting a battery controller to the battery voltage pin, and providing a selective connection between the at least one critical circuit and the battery voltage pin. The method can further include providing a volatile memory in the battery controller for storing a charging algorithm and a charging methodology associated with a battery external to the PLD and connectable to the battery voltage pin. The method can also include coupling a battery charger, controlled by the battery controller, to the battery voltage pin. The battery charger can charge the battery using the charging algorithm and the charging methodology. The method can further include connecting a voltage source pin to the at least one critical circuit and connecting a voltage detector to the voltage source pin. The voltage detector can selectively connect the battery voltage pin to the at least one critical circuit. End of life circuitry can also be coupled to the battery voltage pin.

In another embodiment, a method of fabricating a PLD connectable to multiple batteries is provided. The method includes providing first and second battery voltage pins, providing a selective connection between a battery controller and one of the first battery voltage pin and the second battery voltage pin, and providing a selective connection between the at least one critical circuit and one of the first battery voltage pin and the second battery voltage pin. The method can include connecting an input terminal of an analog demultiplexer to the battery controller, providing a selective connection between a first output terminal of the analog demultiplexer and the first battery voltage pin, and providing a selective connection between a second output terminal of the analog demultiplexer and the second battery voltage pin. The method can also include connecting a first input terminal of an analog multiplexer to the first battery voltage pin, connecting a second input terminal of the analog multiplexer to the second battery voltage pin, and providing a selective connection between an output terminal of the analog multiplexer and the at least one critical circuit. Finally, the method can include providing a non-volatile memory for storing a plurality of charging algorithms and a plurality of charging methodologies. For example, a first charging algorithm and a first charging methodology can be associated with a first battery external to the PLD (connectable via the first battery voltage pin) and a second charging algorithm and a second charging methodology can be associated with a second battery external to the PLD (connectable via the second battery voltage pin). The battery charger, controlled by the battery controller, can be coupled to the input terminal of the analog demultiplexer. In this manner, the battery charger can charge either the first battery using the first charging algorithm and the first charging methodology or the second battery using the second charging algorithm and the second charging methodology.

BRIEF DESCRIPTION OF THE FIGURES

In these figures, similar reference numerals refer to similar elements.

DETAILED DESCRIPTION OF THE FIGURES

Programmable logic devices (PLDs) are well known in the art of integrated circuits (ICs). A PLD can be user-programmed in the field to implement logic designs. One type of PLD is the field programmable gate array (FPGA). In a typical architecture, an FPGA includes an array of configurable logic blocks (CLBs) surrounded by programmable input/output blocks (IOBs). The IOBs provide the interface between the package pins and the CLBs, whereas the CLBs provide the functional elements for constructing logic on the FPGA. The CLBs and IOBs are interconnected by a hierarchy of programmable routing resources. These CLBs, IOBs, and programmable routing resources are customized by loading a configuration bitstream into the FPGA.

FPGAs are typically implemented with volatile memory, such as static random access memory (SRAM), thereby allowing the IC to be reconfigured at the user's discretion. Unfortunately, this design flexibility has the attendant disadvantage of requiring reconfiguration in the event of a power outage. To facilitate this reconfiguration, the current configuration bitstream can be stored in a non-volatile memory IC coupled to the FPGA, which is programmed to download the configuration bitstream if a power outage occurs. Alternatively, to eliminate the need for reconfiguration, a battery back-up of the FPGA can be provided.

Figure 1A:
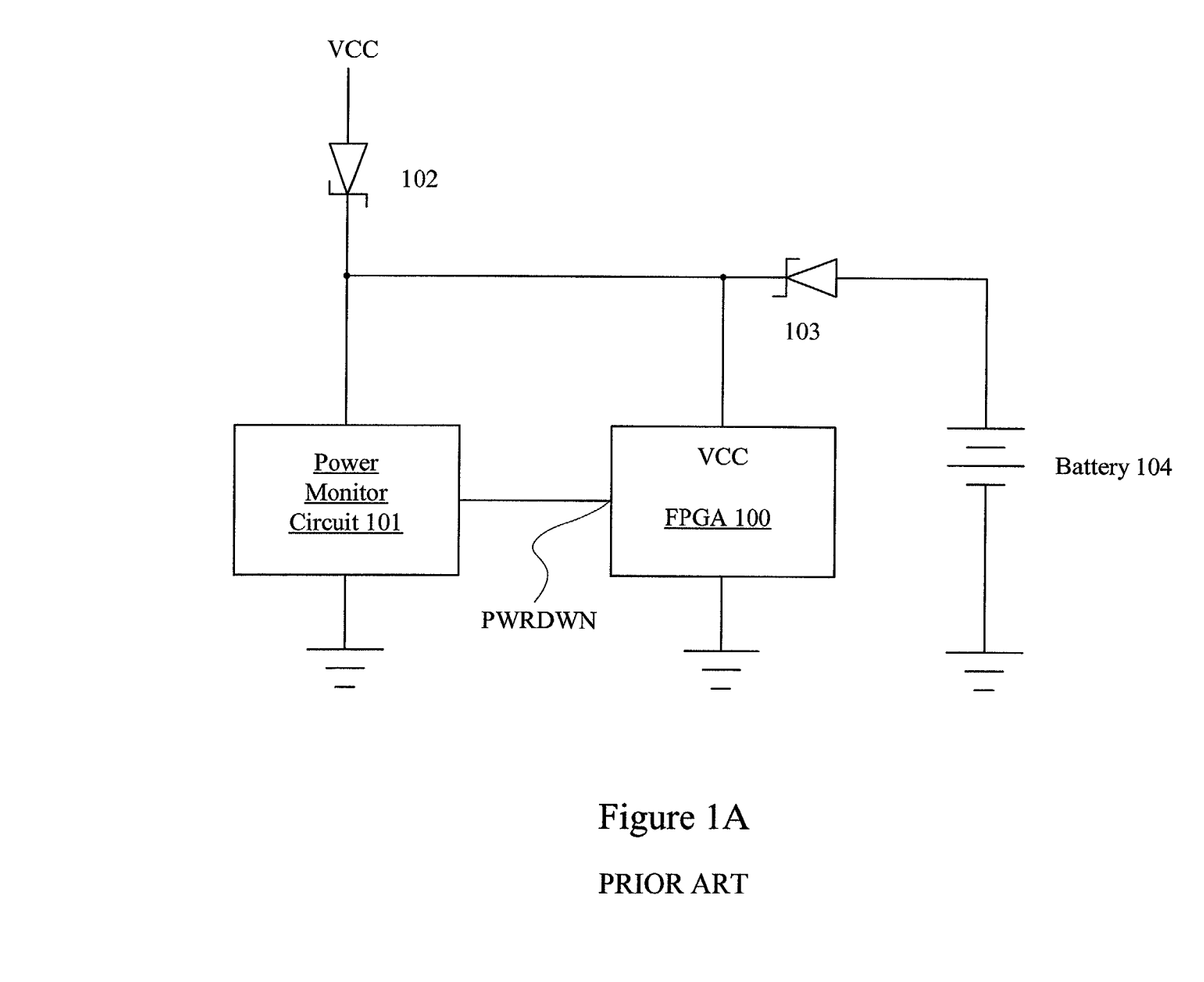
FIG. 1A illustrates a known battery back-up and power-down configuration.

Specifically, the FPGA can be forced into a low-power, non-operational state while supplying the minimal current requirement from a battery, thereby allowing the FPGA to retain its configuration prior to entering the low-power state. FIG. 1A illustrates a battery back-up and power-down circuit for an FPGA 100 that operates at 5.0V+/−5%. In this configuration, a power monitor circuit 101 monitors power supply VCC and pulls a power-down terminal PWRDWN on FPGA 100 to a predetermined voltage whenever VCC falls below 4.0V. In one embodiment, power monitor circuit 101 could be implemented by the Seiko S8054 power device, which has a minimum detect voltage of 3.995V, a maximum detect voltage of 4.305V, a hysteresis of 208 mV, a temperature coefficient of 0.52 mV/° C., and a current $I_{CC}$ at 6V of 2.6 uA. Two Schottky diodes 102 and 103 can power FPGA 100 from either the 5.0V power supply VCC or a 3V lithium battery 104.

In another embodiment, an FPGA can include an on-chip voltage detector, wherein the FPGA is then coupled to a battery using a dedicated terminal VCCBAT. For example, in a Virtex™ II FPGA, sold by Xilinx, Inc., a battery-supported RAM (BRAM) is provided to store a decryption key set for a triple data encryption standard (DES) encryption code. Specifically, up to six 56-bit DES algorithm keys can be stored in the BRAM, and any series of three used for the triple key decryption. In this FPGA, an encrypted configuration bitstream (encrypted by the bitstream generation software by specifying the order of the three keys) can be received and decrypted on-chip using the decryption key set stored in the BRAM. In the event of a power outage, the on-chip voltage detector switches to the battery power supply, thereby allowing the BRAM to retain the decryption key. In one embodiment, the BRAM requires approximately 0.1 uA at 1.0V, minimum. Note that the Virtex II FPGA advantageously prevents a readout of the BRAM, thereby ensuring the security of the decryption key. As soon as power is restored (either from VCC or an auxiliary power source), the on-chip voltage detector switches back to the standard power supply.

In accordance with one feature of the present invention, battery management can be provided on an FPGA, thereby allowing the charging algorithms and methodologies to be changed at the discretion of the user. In this manner, the user can easily upgrade to new chemistries, algorithms, and methodologies as they are developed. Because of this technology flexibility, the user can advantageously reduce battery inventory and ensure the application is implemented with the most advanced power source.

To understand the complexity of batteries, a brief summary of battery types, chemistries, and care as well as an illustrative algorithm/methodology are provided herein.

Battery Types and Chemistries

In a system including a battery, the designer typically considers whether a primary battery providing a single discharge or a secondary battery with recharging capability is more appropriate. Primary batteries simplify the system as they cannot be recharged and therefore require no extra circuitry. Secondary batteries require a method of charging and therefore entail additional circuitry to provide this function. Moreover, secondary batteries can be damaged if charging currents are not controlled, i.e. if the charging methodology is not followed. Note that primary and secondary batteries are considered "types" of batteries, wherein each type of battery has its own voltage capability, temperature tolerance, and life, depending on its chemistry.

The following chemistries are the most common for primary batteries: alkaline, silver-oxide, and lithium. These chemistries can provide cell voltages of 1.5V, 1.55V, and 3.0V, respectively, at the beginning of service. Alkaline batteries are a good choice for operation below 54° C. and above −20° C. However, alkaline batteries have a maximum 1- or 2-year life without a load. Silver oxide batteries are designed to operate from +60° C. to −10° C. and have a less than 5% per year self-discharge rate at 21° C., thereby providing a +10-year life. Finally, lithium batteries can operate in the most adverse temperatures, i.e. up to 150° C. and down to −40° C. Moreover, lithium batteries have a 15-year life without a load and, if sized correctly, may exhibit the same life in an operating system. Thus, silver oxide batteries have the longest life of these three primary batteries.

The following chemistries are most common for secondary batteries: nickel cadmium, nickel metal hydride, lithium, and lead-acid batteries. These chemistries can provide cell voltages of: 1.2V, 1.2V, 3.6V, and 2.0V, respectively, after charge under nominal load. The self-discharge rates of all of these batteries is at best 1% per month. Therefore, recharging of secondary batteries is typically recommended within 30 days. In fact, nickel metal hydride batteries, which are used in cell phones because of their high energy density, are particularly prone to high discharge rates. Thus, if a user misses even one day of using the battery followed by re-charging, then the cell phone may be inoperable. The number of deep (>80%) charge/recharge cycles is usually less than 200 for most secondary batteries.

Battery Care

In addition to the considerations described above regarding battery voltage, temperature tolerance, and life, system design can also include an analysis of use restrictions. Specifically, certain batteries, due to their chemistries, may have attendant disposal, availability, and/or use limitations that could adversely affect product distribution. For example, nickel cadmium, lead acid, and silver oxide batteries have chemical compositions that are considered hazardous waste and therefore have corresponding disposal limitations. Moreover, the availability of batteries can vary. For example, although nickel cadmium and alkaline batteries are generally available world-wide, other batteries, such as lithium and silver oxide are less commonly available.

Most batteries contain highly corrosive base or acid electrolytes, and will seriously damage or destroy electrical components if they leak. Any battery will leak if it is overcharged, if a primary battery is charged, or if the battery suffers physical damage (e.g. is dented or punctured).

Additionally, any battery may pose a risk of explosion or fire if it is shorted (wherein the use of a small ⅛ Watt surface mount resistor as a fuse can be used to reduce this risk).

Battery Algorithm and Methodology

The identification of the appropriate charging algorithm and methodology is necessary to charge a secondary battery. For example, in one charging methodology, the current is turned on and off at predetermined intervals and then the battery temperature is checked. In another example charging methodology, the current is turned on and off at a second predetermined interval and then the voltage is checked at the battery terminals.

Unfortunately, in many instances, charging algorithms and methodologies are ignored or simplified because of their complexity. However, if a battery is stressed by an inappropriate recharge operation, then that battery will undesirably fail before its designed end of life. For example, a nickel cadmium battery has between 200–500 deep discharge cycles and many thousands more if it does not deeply discharge. If a user allows the nickel cadmium battery to discharge past a certain point, then its life can be severely limited to only 100–200 discharge cycles. In fact, in general, any deviation from the algorithm or methodology recommended by a battery manufacturer can result in reduced life or even unsafe operation of that battery.

In accordance with one feature of the invention, the FPGA can include the battery management, thereby allowing the FPGA to automatically recharge a secondary battery using the appropriate algorithm and methodology and thus minimize stress on the battery relating to recharging. Many applications using secondary batteries could benefit from the advantages of using an FPGA with battery management provided on-chip. For example, satellites in space typically use secondary batteries. Therefore, to ensure best use of the significant equipment investment in these satellites, the user should implement the manufacturer's required charging algorithm.

Although a battery charging ASIC could be used, the battery choice for such a satellite might be made years before the satellite is actually launched. In contrast, using an FPGA with battery management on-chip, the battery choice could be made at the time of installation of the battery itself, thereby allowing the latest (and theoretically the best) battery technology to be used. Alternatively, in this example, different batteries (different secondary batteries, primary batteries, or a combination of secondary and primary batteries) could be provided in the satellite. In this example, in the event of one battery failure, the succeeding battery could be seamlessly incorporated into the operating system with the use of a single IC, i.e. the FPGA. As mentioned previously, a battery charging ASIC is tailored for a specific battery type/chemistry. It logically follows that multiple battery charging ASICs would need to be included in such a satellite. Therefore, compared to known battery charging ASICS, an FPGA including on-chip battery management can also significantly reduce the number of ICs required for battery operation.

Figure 1B:
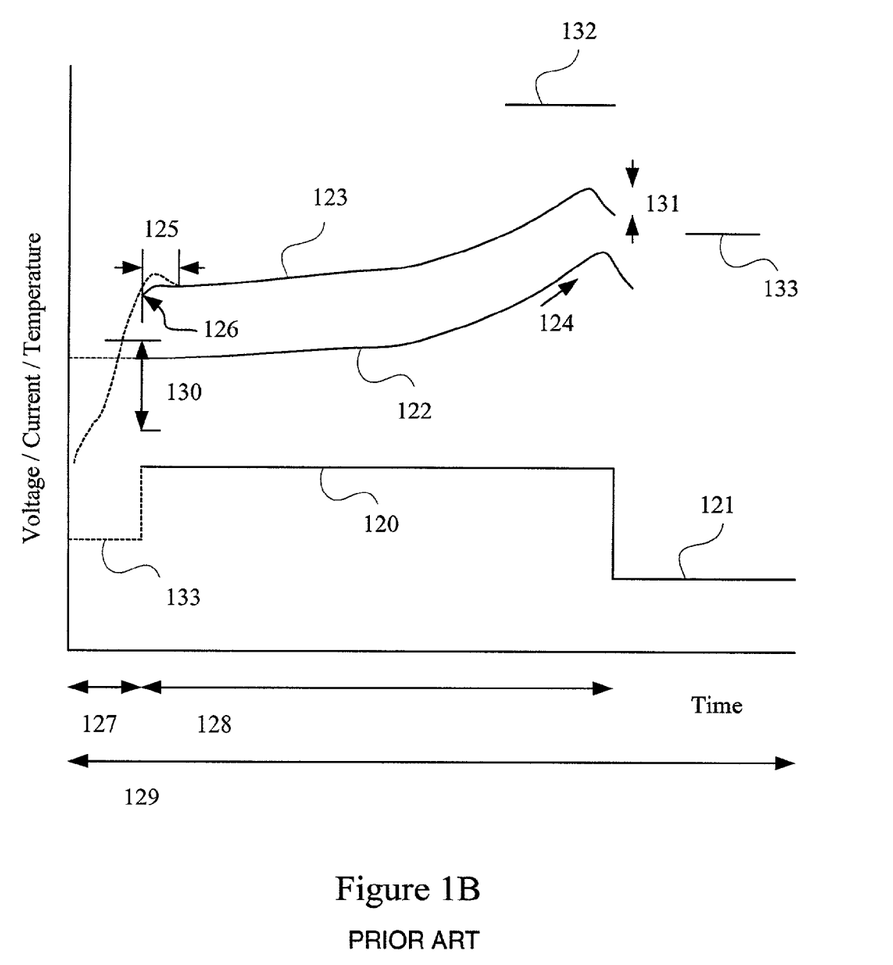
FIG. 1B illustrates a known charging battery algorithm and methodology for a nickel metal hydride battery.

An illustrative charging algorithm and methodology for a nickel metal hydride battery from Panasonic is provided herein to emphasize the advantages of automating the recharging process. Referring to FIG. 1B, a rapid charge current 120 of between 0.5 CmA and 1 CmA is provided, wherein C is defined as the current time capacity of the battery in ampere or milliampere hours. For example, 1 CmA for a 150 mahr battery would be 150 mA. Charging the metal hydride battery with a current greater than 1 CmA can create an undesirable electrolyte leakage. If the temperature of the metal hydride battery is under 0° or over 40° C. at the beginning of the charge, then a low-level charge current between 0.033–0.05 CmA is used instead of the rapid charge current 120.

In the case that the metal hydride battery is excessively discharged or deep-discharged, a medium-level current 133 can be provided initially followed by the rapid charge current 120 after a battery voltage 123 has risen to a predetermined level. Specifically, the voltage begins at approximately 0.8V/cell and transitions (see arrow 126) at a current of 0.2–0.3 CmA. The maximum battery voltage 132 is approximately 1.8V/cell. Note that the rapid charge current can be switched to the low-level charge current if the battery voltage 123 reaches approximately 1.8V/cell due to any malfunction.

The delta voltage drop 131 is typically 5 to 10 mV/cell. The rise in the battery temperature per unit of time is approximately 10 to 2° C./min. When a predetermined rise 124 is detected during the rapid charge period 128, the rapid charge current 120 is switched to the low-level charge current 121. Note that the voltage drop also corresponds to the completed recharge operation. If the battery temperature reaches an upper limit 133, then the rapid charge current 120 should be decreased to the low-level charge current 121 to ensure the metal hydride battery is not damaged.

An initial delay 125 of up to 10 minutes can be provided to prevent the delta voltage detection circuit from being activated by a pseudo voltage change, wherein such a pseudo voltage change can occur if the metal hydride battery has been non-operational for a predetermined period of time or excessively discharged. However, the dT/dt detection circuit can be activated during this delay.

In the Panasonic nickel metal hydride battery, the rapid charge transfer time 127, the rapid charge time 128, and the total charge time 129 are 60 minutes, 90 minutes, and 10–20 hours, respectively. Because the overcharging of nickel metal hydride batteries, even by low-level charging, can adversely affect the characteristics of the batteries, close adherence to these times is highly recommended. As noted by Panasonic, the temperature and voltage of these batteries varies depending on various factors including the shape of the battery pack, the number of cells, and the arrangement of the cell. Additional details regarding the Panasonic nickel metal hydride battery are provided at the following address on the Panasonic Web site: http://www.panasonic.com/industrial/battery/oem/images/pdf/nimhchar.pdf FPGA Implementation In accordance with one feature of the invention, a battery can be provided external to an FPGA integrated circuit. Note that this battery can be integrated into the package of the FPGA or can be a separate component in a system including the FPGA. In one embodiment providing optimal user flexibility, the battery is provided as a separate component, thereby allowing the user to implement the power source with either a primary battery or a secondary battery.

In many applications, it would be highly advantageous to be able to provide the FPGA with information regarding the coupled battery, thereby allowing the FPGA to make different use, better use, or optimal use of that battery. Logically, if the battery chemistry is unknown, then the operating voltage and the specification of what is fully charged or half-charged cannot be determined. Moreover, if the charging algorithm and methodology are unknown, then recharging (of a secondary battery) cannot be done accurately.

In accordance with one feature of the invention, the configuration bitstream can include information regarding one or more batteries, i.e. their type, chemistry, charging algorithm, and charging methodology. This information can be stored in the BRAM for use during subsequent FPGA and/or battery operations. For example, a user could query the FPGA on the type of battery (assuming the battery is embedded in the FPGA package and therefore is inaccessible for user identification). In another example, the FPGA could access the information to automatically recharge a secondary battery when the charging level drops below a threshold voltage. In one embodiment, the BRAM can include look-up tables (LUTs) that are provided in certain CLBs of the FPGA. In another embodiment, the BRAM can include block RAM or other memory arrays provided on the FPGA.

Figure 2:
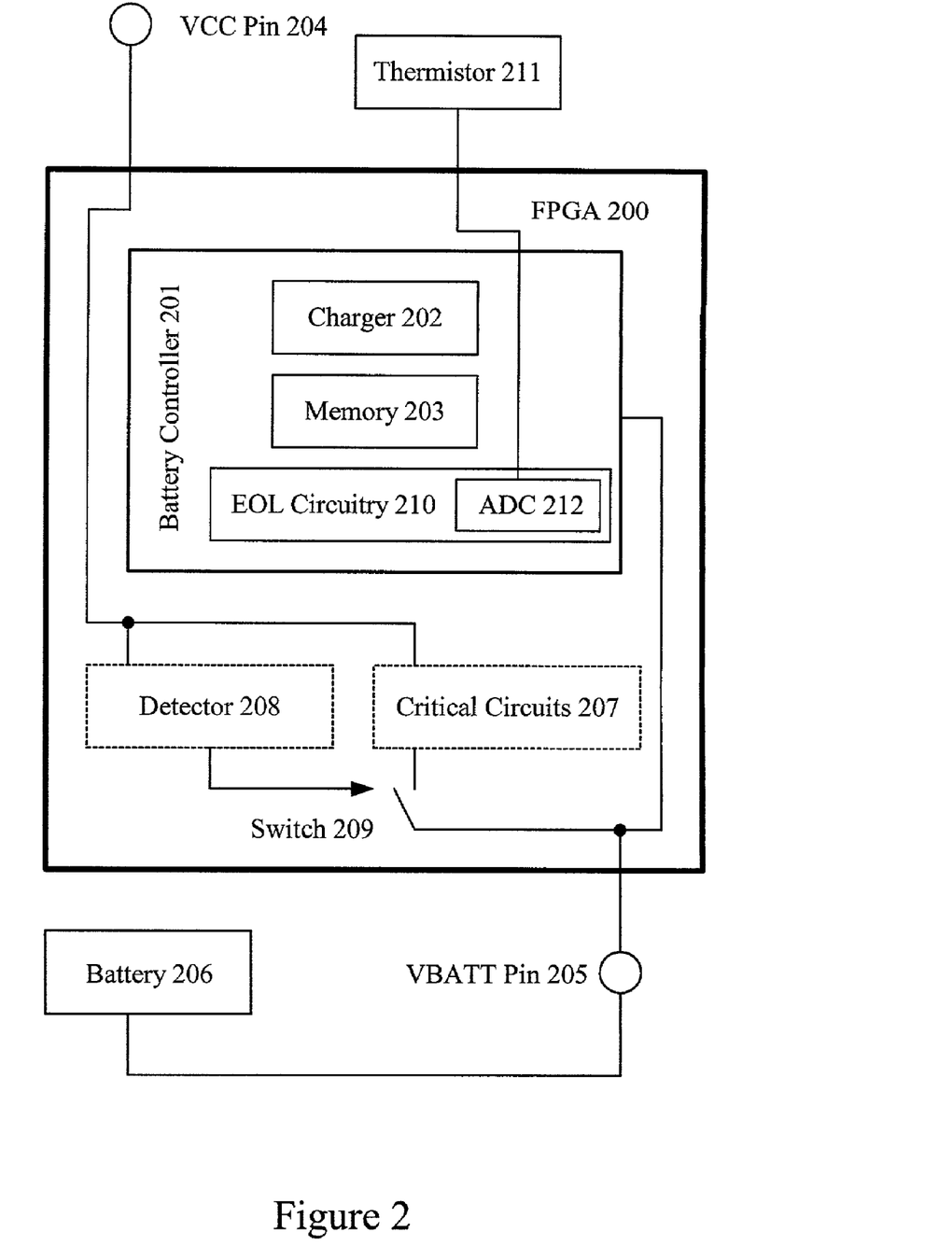
FIG. 2 illustrates an FPGA including a battery controller on-chip for controlling an off-chip battery.

To effectively use this battery information, an FPGA can include a controller. FIG. 2 illustrates a simplified FPGA 200 including a battery controller 201 in accordance with the invention. FPGA 200 further includes a standard power supply VCC pin 204 and a dedicated, battery voltage VBATT pin 205. Battery controller 201 can control a battery (primary or secondary) external to FGPA 200 via VBATT pin 205 (note that FPGA 200 could refer to an FPGA IC or a packaged FPGA IC). Because of critical circuits 207, e.g. a BRAM for providing information regarding one or more batteries, decrypting an encrypted bitstream, or any other circuits providing critical functions, a continuous power supply is required. In this embodiment, the power can be supplied either from VCC pin 204 or VBATT pin 205. Note that VCC pin 204 is directly connected to critical circuits 207, whereas VBATT pin 205 is selectively connected to critical circuits 207 via a switch 209.

A standard on-chip detector 208, which is coupled to VCC pin 204, can detect whether the power supplied by VCC pin 204 is above a threshold voltage. If not, detector 208 can activate a switch 209, thereby coupling critical circuits 207 to VBATT pin 205. In this manner, until that threshold voltage can be maintained, critical circuits 207 are powered by battery 206.

In accordance with one feature of the invention, battery controller 201 can include a charger 202, thereby allowing battery 206 to be implemented with a secondary battery. In a preferred embodiment, memory 203 (e.g. volatile RAM, such as SRAM or DRAM) can provide the appropriate charging algorithm and methodology for battery 206. Battery charger 202 could be implemented with dedicated logic on FPGA 200, or implemented, at least in part, using the programmable fabric of FPGA 200. Specifically, to build battery charger 202, digital values will need to be converted into analog voltages or analog currents. In one embodiment, a standard digital-to-analog converter (DAC) known by those skilled in the art can be used. Because of the desired analog result, the DAC (or any functional equivalent) is typically implemented with dedicated logic. In another embodiment, battery charger 202 can include a transistor that is turned on and off at predetermined intervals, thereby providing a pulse-width-modulated (PWM) signal. Note that providing variable current on the output pins of FPGA 200 is known in the art, typically by turning on more/less output transistors. Therefore, by including battery controller 201 (comprising charger 202 and memory 203), FPGA 200 is fully capable of recharging battery 206.

Note that each battery chemistry has its own definition of what the "end of life" is. To address this issue, battery controller 201 can include end of life circuitry 210. In one embodiment, end of life circuitry 210 can comprise an analog-to-digital (A/D) converter 212 that senses the voltage (e.g. a voltmeter implemented in hard logic) as well as additional circuitry to compare this voltage to a table of end of life voltage (wherein the table could be built using the configuration bitstream). Alternatively, the additional circuitry could include a comparator (implemented using programmable resources) that compares the sensed voltage to a reference voltage. In one embodiment, this reference voltage could be a band-gap reference voltage generated by programmable resources on FPGA 200.

In one embodiment, end of life (EOL) circuitry 210 could also include circuitry for measuring battery temperature, which also can determine the level of charging of the battery. For example, during a recharge of a nickel cadmium battery, the temperature at the terminals of the battery continues to rises until a chemical reaction stops. At this point, the temperature drops dramatically, thereby signally the completion of the recharge. In fact, in this battery chemistry, a temperature drop is a more accurate recharge indicator than the terminal voltage on the battery. To measure temperature in one embodiment, end of life circuitry 210 could be coupled to a thermister 211 (implemented as hard logic external to FPGA 200) via A/D converter 212.

Advantageously, the charging of battery 206 can be done while FPGA 200 is connected to the primary power source VCC. Currently, for example referring back to the prior art described in FIG. 1, battery 104 would have to be disconnected from FPGA 100 before recharging could be performed. Otherwise, the recharging of battery 104 would adversely affect the voltage provided to the VCC terminal of FGPA 100. In contrast, in FPGA 200 (FIG. 2), battery 206 can be selectively isolated from critical circuits 207 via switch 209, thereby allowing charger 202 to perform a recharge operation battery 206 during any time that battery 206 is not coupled to critical circuits 207.

In one embodiment, any portion of battery controller 201 not implemented as hard logic could be implemented using a programmable logic resource, e.g., a "core". Specifically, some FPGAs, like the Virtex II FGPA, can be programmed to incorporate blocks with a pre-designed functionality (programmable logic resources) called a "core". In one embodiment, a core can include a predetermined set of configuration bits that program the FPGA to perform one or more functions. In another embodiment, a core can include source code or schematics, which describe the logic and connectivity of a design. Cores can be provided with an optimally floorplanned layout for specific FPGAs. Moreover, cores can also be parameterizable, i.e. allowing the user to enter parameters to activate or change certain core functionality. For example, a parameterizable battery controller core could allow the user to enter the number of batteries being coupled to the FPGA (described in further detail in reference to FIG. 3) or to enter a new battery type, charging algorithm, and charging methodology.

Figure 3:
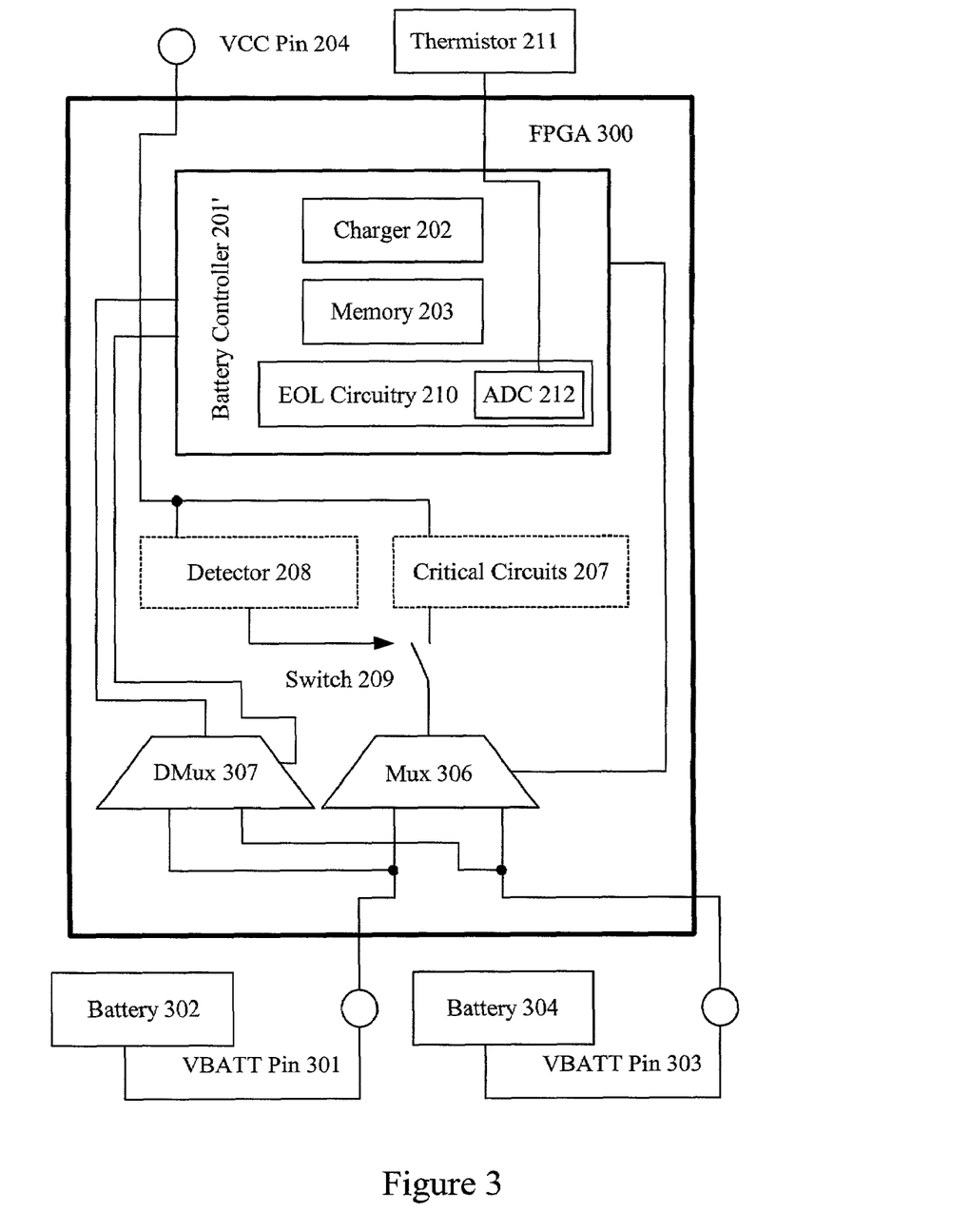
FIG. 3 illustrates an FPGA including a battery controller on-chip for controlling multiple off-chip batteries.

FIG. 3 illustrates a simplified FPGA 300 similar to FPGA 200, but capable of selectively coupling one of a plurality of batteries to critical circuits 207. Specifically, in one embodiment, an analog multiplexer 306 can be provided to allow a parameterizable battery controller 201' to selectively couple one of N batteries to critical circuits 207, wherein N is a parameter that can be set by the user. One skilled in the art will appreciate that other well know techniques and circuits can also be used to perform the functions of the analog multiplexer 306 In FIG. 3, parameterizable battery controller 201' can selectively couple one of battery 302 (via VBATT pin 301) and battery 304 (via VBATT pin 303) to critical circuits 207. An analog demultiplexer 307 allows parameterizable battery controller 201' to selectively charge one of batteries 302 and 304. Logically, if battery 302 is coupled to critical circuits 207, then battery 304 can be recharged and vice versa. In light of the flexibility provided by parameterizable battery controller 201', batteries 302 and 304 could be any type or chemistry. Note that in some embodiments, the primary voltage source might not be present at all (thus leaving VCC pin 204 unused). In such embodiments, multiple batteries could be advantageously used as primary voltage sources.

Many new battery chemistries, including aluminum air, carbon zinc, and zinc air batteries, are being developed. The battery controller of the invention can advantageously update systems to leverage the attendant benefits of these new chemistries. In one embodiment, this updating can include a partial configuration bitstream loaded in the FPGA to store the new algorithm and methodology in memory 203.

SUMMARY

Only a few years ago, designers had a limited number of primary batteries and secondary batteries from which to choose. Now, a plethora of battery chemistries exist. In fact, many applications spawn the development of their own custom battery chemistries. However, once chosen (typically early in the design process), the battery type and chemistry are effectively locked into the design. The associated ASIC chargers for these batteries are expensive and waste increasingly valuable system space. Fortunately, FPGAs are becoming more prevalent in many types of equipment and networks, including, for example, set-top boxes, personal communication systems, MP3 players, Cisco servers, and Lucent transmission systems.

An FPGA including a battery controller in accordance with the invention can ensure that power demands for any application can be met. By using this programmable solution, the user can make the decision regarding battery choice much later in the design process, reduce the inventory of batteries associated with the system/product, increase the life of the batteries, and upgrade to the newest technology battery at the user's discretion.

The descriptions of the invention provided herein are illustrative only and not limiting. Specifically, various embodiments of the invention have been described in detail above. Modifications to those embodiments will be apparent to those skilled in the art. For example, although only two batteries are shown in FIGS. 2 and 3, any number of batteries could be connected to an FPGA using the appropriate analog multiplexers and demultiplexers. Therefore, the scope of the present invention can be defined only by the appended claims.

What is claimed is:

1. A programmable logic device (PLD) comprising:
   a battery voltage pin;
   a battery controller connected to the battery voltage pin; and
   at least one critical circuit implemented in programmable logic of the PLD and selectively connected to the battery voltage pin;
   a memory for storing a charging algorithm and a charging methodology associated with a battery connectable to the battery voltage pin;
   a voltage source pin connected to the at least one critical circuit; and
   a voltage detector connected to the voltage source pin, the voltage detector selectively connecting the battery voltage pin to the at least one critical circuit in response to a voltage drop at the voltage source pin.

2. The PLD of claim 1, wherein the battery controller includes:
   a battery charger controlled by the battery controller and operatively coupled to the battery voltage pin, the battery charger for charging the battery using the charging algorithm and the charging methodology.

3. The PLD of claim 1, wherein the battery controller further includes end of life circuitry operatively coupled to the battery voltage pin.

4. The PLD of claim 1, wherein the battery controller includes programmable logic resources.

5. A programmable logic device (PLD) comprising:
a first battery voltage pin;
a second battery voltage pin;
a battery controller selectively connected to one of the first battery voltage pin and the second battery voltage pin;
at least one critical circuit implemented in programmable logic of the PLD and selectively connected to one of the first battery voltage pin and the second battery voltage pin;
a voltage source pin connected to the at least one critical circuit;
a selector arrangement coupled to the first and second battery voltage pins and adapted to couple the at least one critical circuit to one of the first and second battery voltage pins;
an analog demultiplexer including an input terminal connected to the battery controller, a first output terminal selectively connected to the first battery voltage pin, and a second output terminal selectively connected to the second battery voltage pin; and
an analog multiplexer including a first input terminal connected to the first battery voltage pin, a second input terminal connected to the second battery voltage pin, and an output terminal selectively connected to the at least one critical circuit.

6. The PLD of claim 5, wherein the battery controller includes:
a memory for storing a plurality of charging algorithms and a plurality of charging methodologies, wherein a first charging algorithm and a first charging methodology are associated with a first battery external to the PLD and connectable to the first battery voltage pin, and wherein a second charging algorithm and a second charging methodology are associated with a second battery external to the PLD and connectable to the second battery voltage pin; and
a battery charger controlled by the battery controller and operatively coupled to an input terminal of the analog demultiplexer, the battery charger for charging one of the first battery using the first charging algorithm and the first charging methodology and the second battery using the second charging algorithm and the second charging methodology.

7. The PLD of claim 5, wherein the selector arrangement includes
a voltage detector connected to the voltage source pin, the voltage detector selectively connecting the output terminal of the analog multiplexer to the at least one critical circuit.

8. The PLD of claim 5, wherein the battery controller further includes end of life circuitry operatively coupled to at least one the first battery voltage pin and the second battery voltage pin.

9. The PLD of claim 5, wherein the battery controller includes programmable logic resources.

10. A method of fabricating a programmable logic device (PLD), the method comprising:
providing a first battery voltage pin;
providing a second battery voltage pin;
providing a selective connection between a battery controller and one of the first battery voltage pin and the second battery voltage pin;
providing a selective connection between programmable logic of the PLD and one of the first battery voltage pin and the second battery voltage pin;
providing a volatile memory for storing a plurality of charging algorithms and a plurality of charging methodologies, wherein a first charging algorithm and a first charging methodology are associated with a first battery connectable to the first battery voltage pin, and a second charging algorithm and a second charging methodology are associated with a second battery connectable to the second battery voltage pin;
connecting an input terminal of a demultiplexer to the battery controller;
providing a selective connection between a first output terminal of the demultiplexer and the first battery voltage pin;
providing a selective connection between a second output terminal of the demultiplexer and the second battery voltage pin;
connecting a first input terminal of a multiplexer to the first battery voltage pin;
connecting a second input terminal of the multiplexer to the second battery voltage pin; and
providing a selective connection between an output terminal of the multiplexer and the at least one critical circuit.

11. The method of claim 10, further including:
coupling a battery charger, controlled by the battery controller, to the input terminal of the demultiplexer, the battery charger for charging one of the first battery using the first charging algorithm and the first charging methodology and the second battery using the second charging algorithm and the second charging methodology.

12. The method of claim 11, further including:
connecting a voltage source pin to the at least one critical circuit; and
connecting a voltage detector to the voltage source pin, the voltage detector for selectively connecting the output terminal of the analog multiplexer to the at least one critical circuit.

13. The method of claim 12, further including providing a selective connection between end of life circuitry and at least one of the first battery voltage pin and the second battery voltage pin.

14. The method of claim 10, further including implementing at least one of the selective connections with programmable logic resources.

* * * * *